United States Patent [19]
Andersson

[11] Patent Number: 5,994,983
[45] Date of Patent: Nov. 30, 1999

[54] MICROWAVE CIRCUIT, CAPPED MICROWAVE CIRCUIT AND USE THEREOF IN A CIRCUIT ARRANGEMENT

[75] Inventor: Ronny Andersson, Tullinge, Sweden

[73] Assignee: Sivers IMA AB, Sweden

[21] Appl. No.: 08/981,734

[22] PCT Filed: Jun. 25, 1996

[86] PCT No.: PCT/SE96/00834

§ 371 Date: Dec. 23, 1997

§ 102(e) Date: Dec. 23, 1997

[87] PCT Pub. No.: WO97/01872

PCT Pub. Date: Jan. 16, 1997

[30] Foreign Application Priority Data

Jun. 27, 1995 [SE] Sweden ................................ 9502326

[51] Int. Cl.⁶ .................................. H01P 3/08; H05K 1/11
[52] U.S. Cl. ............................ 333/246; 333/260; 333/33; 174/262
[58] Field of Search .............................. 333/33, 238, 246, 333/260; 174/260–262, 264

[56] References Cited

U.S. PATENT DOCUMENTS

| | | | |
|---|---|---|---|
| 4,276,558 | 6/1981 | Ho et al. ............................. | 333/247 X |
| 4,626,805 | 12/1986 | Jones .......................................... | 333/33 |
| 5,057,798 | 10/1991 | Moye et al. .............................. | 333/33 |
| 5,229,727 | 7/1993 | Clark et al. ................................ | 333/33 |
| 5,424,693 | 6/1995 | Lin ...................................... | 333/246 X |
| 5,428,327 | 6/1995 | Bahl ........................................ | 333/246 |
| 5,832,598 | 11/1998 | Greenman et al. ................. | 333/246 X |

FOREIGN PATENT DOCUMENTS

| | | | |
|---|---|---|---|
| 0444820 | 4/1991 | European Pat. Off. . | |
| 2 280 790 | 2/1995 | United Kingdom ................... | 333/246 |
| WO9509452 | 6/1995 | WIPO . | |

*Primary Examiner*—Robert Pascal
*Assistant Examiner*—Barbara Summons
*Attorney, Agent, or Firm*—Christie, Parker & Hale, LLP

[57] ABSTRACT

A microwave circuit having a two-sided substrate on which a microwave lead-through is arranged in the form of a symmetrical lead-through structure, being provided by opposite metallizationless areas on the upperside and the underside of the substrate and comprising a lead-through conductor, coplanar width adaption segments and first and second line segments connected thereto, the ground of said segments comprising opposite metallization parts being inter-connected through via holes. In a sealed microwave circuit a seal lead-through comprises said lead-through structure and a microstrip line segment.

9 Claims, 6 Drawing Sheets

MICROWAVE CIRCUIT, CAPPED MICROWAVE CIRCUIT AND USE THEREOF IN A CIRCUIT ARRANGEMENT

BACKGROUND OF THE INVENTION

This invention is related to a microwave circuit comprising a two-sided substrate having a lead-through structure for interconnecting a first microstrip conductor segment on the upperside of the substrate with a second microstrip conductor segment on the underside of the substrate. The invention further relates to a sealed design of such a microwave circuit, in which the sealing is obtained by means of a metal lid which is arranged on the substrate. Furthermore the invention is related to a use of such a microwave circuit as a function module unit in a circuit arrangement which is built by modules.

Microwave signals are the designation of electrical signals in the frequency range 0.5–50 GHz. Microwave circuits for handling such microwave signals generally consist of a substrate of an insulating material, commonly aluminum oxide. By sputtering followed by plating of a pattern on the substrate transmission conductors, resistors and optionally capacitors may be built. Remaining components are soldered or glued onto the substrate.

A general problem in microwave circuits of the type in question is that the high signal frequencies involved demand electrical matching at existing interfaces in the circuit, meaning that channels in which signals are transmitted and meeting each other at said interfaces shall have identical impedances, customarily 50 Ohm. For example, interfaces of this kind appear between inherent circuit elements and between different conductor sections. Impedance differences at said interfaces give rise to partial reflection of the signal and a consequent loss of power. The loss of power increases with an increasing frequency. The signal power is expensive at the high frequency levels involved, specifically in applications requiring a high output power level. From this it follows that the quality demands on matching are very high.

The provision of good matching at all interfaces in a microwave circuit means very often that difficult problems must be solved by the circuit design. Specifically, this problem is prominent when using a two-sided substrate in which the signal path for external connection of the circuit includes a metal plated hole, a so called through-hole, passing the substrate and interconnecting microwave components on the upperside of the substrate with an external connection terminal on the underside of the substrate. Said through-hole introduces discontinuities in the impedance level of the signal path. The through-hole shows an increased characteristic impedance due to the fact that an adjoining groundplane is missing. This part of the transmission line corresponds to an inductive series connected element. Furthermore, the conductors which are connected to said hole cross over a groundplane free area immediately adjoining the through-hole, said conductors introducing further inductive series elements.

Prior art in this field teaches the introduction of a compensating capacitive parallel element adequately positioned along the transmission line in the neighborhood of said hole by decreasing the distance between conductor and ground, widening of the microstrip conductor over a short distance, or a parallel connection of a distributed or a concentrated capacitive element of adequate design.

This compensation technology means a consequent introduction of a lowpass filter structure having an upper frequency limit restricting the usefulness of the lead-through.

One example of this prior art in a microwave circuit of the kind mentioned in the introduction has been disclosed in U.S. Pat. No. 4,626,805.

The disclosed microwave circuit (24) comprises a two-sided substrate (26), carrying on the upperside the microwave components of the microwave circuit and the transmission line for interconnecting the same and external connection of the microwave circuit, the underside being provided with a ground plane, coplanar conductors and external connection terminals. The external connection is provided by means of a through-hole (40) in said substrate which interconnects the transmission line (36) with said coplanar transmission line (30). The external connection terminals have connection pins (19), normally provided by means of a so called lead-frame, being soldered to the underside of the substrate onto its groundplane. By means of a metal lid (25) the microwave circuit (24) may be sealed hermetically and shielded. The microwave circuit is intended for surface mounting on an underlying circuit board (10) which is provided with a transmission line (16) of a width which is adapted to said connecting pins as well as coplanar ground terminals combined therewith.

The circuit thus described shows the problems which have been indicated above because an inductive discontinuity is introduced by said through-hole due to the fact that said through-hole lacks a capacitive coupling to adjoining ground conductors/ground plane. Between the metallization around said through-hole and the adjoining ground plane on the underside of the circuit the ground plane a free area or gap (G) appears, being traversed by the transmission lines connected to said through-hole on the upperside and the underside of the substrate. The transmission line parts which are situated directly above said gap as well as said through-hole form inductive series elements in the transmission between upperside and underside. These inductive elements are compensated by empirically dimensioning the size of the gap on the underside, providing thereby an additional capacitance. Thereby a correction of the characteristic impedance is obtained within a limited frequency range.

One further embodiment has been disclosed in which a corresponding additional inductance is provided by said respective transmission lines, the same being compensated for by the additional capacitance of said gap as well as a widened segment of the upperside transmission line. The disclosed circuit designs are useful for frequencies up to 20 GHz and provide for acceptable power losses within this frequency range. For frequencies above 20 GHz the losses increase rapidly making thereby the circuit practically useless.

SE-9303142-5, which is owned by the Applicant, discloses one further example of this prior art. The microwave circuit disclosed therein comprises a conductor (10) on the upperside of the substrate, traversing a groundplane-less area around the metallization of the through-hole (7) on the underside of the substrate, introducing thereby an additional inductive impedance in correspondence with the circuit according to U.S. Pat. No. 4,626,805, which has been disclosed above. In this case, the compensation is obtained by means of a so called matching pattern which is connected to the groundplane and which is provided on the upperside primarily at said groundplane-less segment of the conductor adjoining the through-hole. By an adequate dimensioning of the gap between said matching pattern and the conductor a compensating additional capacitive impedance is obtained. This solution has the advantage of introducing said compensation at the mismatch source, that is at said segment of the conductor, which allows for a circuit which is useful for frequencies up to at least 26 GHz.

Another example of this prior art has been disclosed in U.S. Pat. No. 5,057,798, disclosing a transmission line from upperside to underside of a substrate, comprising a through-hole and waveguides connected thereto. Compensation means are provided in order to obtain an additional capacitance compensating the additional inductance of the through-hole. Two embodiments have been disclosed, firstly ground from a plurality of nearby through-holes (via-openings) to form a "coaxial structure", secondly, when microstrip waveguides are used, a specifically adapted design of the microstrip line end. The disclosed transmission line design is used for saving substrate area by arranging desirable parts of the transmission line on the underside of the substrate. The transmission line has the disadvantages which have been indicated above because the same include specifically designed compensating means.

Microwave circuits of the actual type as well have to fulfill the requirement of being useful within a wide frequency range, for example from 2 GHz up to 26 GHz, maintaining substantially identical performance in respect of power losses and stable signal level within the complete frequency range. The use of compensating elements according to prior art, contradicts the requirement on a wide frequency range because the undesirable, parasitic additional impedances will vary with the signal frequency in the same way as the additional impedances which are introduced by means of compensating measures, from which follows that the compensation will be optimized within limited frequency intervals.

SUMMARY OF THE INVENTION

One object of invention is to provide a microwave lead-through on a two-sided substrate not showing the disadvantages of prior art and allowing a circuit performance to be obtained in accordance with the requirements mentioned above.

The object of invention is obtained by a microwave circuit of the kind mentioned in the introduction having a lead-through which is symmetrically arranged by means of opposite, equally sized, metallizationless areas on the upperside and the underside, said lead-through structure, within said metallizationless areas, comprising in series the conductor part of a first width adaption segment of coplanar type for connection to the conductor of said first microstrip segment the conductor of a first coplanar waveguide segment a lead-through conductor the conductor of a second coplanar waveguide segment the conductor part of a second width adaption segment of coplanar type for connection to the conductor of said second microstrip segment, in which the centre of said lead-through conductor is arranged symmetrically in relation to the end parts of said coplanar waveguide segments and in which the respective conductors of said first and second waveguide segments have a width which has been adapted to the width of said lead-through conductor, and the ground of said coplanar segments being provided by means of opposite metallization areas on the upperside and the underside, said areas being interconnected by means of equidistantly arranged lead-throughs along the structure and transverse to the same, said lead-throughs together with the respective ground metallizations of said microstrip segments being comprised in respectively continuous ground metallization areas on the underside and the upperside, thereby obtaining a continuous lead-through structure having, along the structure, an impedance level which is substantially uniform and which may be adapted to the environment.

By means of the symmetrical, continuous lead-through structure according to the invention one of the main reasons behind the problem of impedance matching in the microwave circuits according to prior art is eliminated, that is the fact that one or several parts of the conductors of the signal path has no adequate ground and/or is passing over an opposite groundplane-less gap or area. From this follows that the need of introducing specifically designed compensating impedances is eliminated, thereby allowing for an increased frequency range and a frequency diagram which is more even and in turn increases the usefulness of the microwave circuit in modern microwave applications. The lead-through structure according to the invention means from a principle point of view a solution for obtaining a lead-through maintaining the continuity of groundplanes as well as microwave conductors. Furthermore the impedance and the conductor width of the lead-through structure may be easily adapted to surrounding conductors. The differences in relation to prior art are evident from the fact that the symmetrical lead-through structure according to the invention, being provided within said opposite metallizationless areas, may be appreciated as the functional equivalent of the via-hole of the lead-throughs according to prior art.

An implementation of the lead-through conductor in the form of a metallized or metal-filled via-hole requires special measures to be taken in order to obtain a good impedance matching, partly for avoiding an introduction of an inductive series element by means of the lead-through as such, partly for avoiding discontinuities of conductors or ground when connections are made to the via-hole. The dimension of the via-hole as such must reach the smallest allowable size in order to allow for a good plating of the hole. On both sides of the substrate said hole has a circumventing circular metallization, a so-called collar, being substantially larger than the hole as such, said collar introducing, when connecting the via-hole according to prior art, a large discontinuity in respect of the width of the conductor which gives rize to signal reflection. Due to the fact that the lead-through structure according to the invention comprises a coplanar conductor on the upperside as well on the underside, in which the ground planes are interconnected continuously by means of via-holes and in which the ground planes oppositely beneath the conductor segments have been eliminated, an adaption of the conductor thereof to the dimensions of said collar is made possible.

This is obtained by a preferred embodiment of the microwave circuit according to the invention, wherein said opposite metallizationless areas are substantially rectangular, said opposite metallization areas forming the ground planes of said coplanar segments, are interconnected by means of parallel lead-through rows alongside edge areas adjoining the long sides of said rectangular areas, and said lead-through conductor are arranged for penetrating said substrate at the center of said metallizationless areas and comprises a metallized or metal-filled via-hole having on the upperside and the underside adjoining substantially circular metallizations of a diameter which substantially corresponds to the width of the conductors of said coplanar line segments.

In a further development of the lead-through structure according to the invention said lead-through conductor may be obtained by means of two or several via-holes being provided along overlapping end parts of the respective coplanar waveguide segment conductors thereof. By this measure a parallel connection of the additional inductive impedances of the via-holes is obtained and thereby the total additional impedance is decreased, which allows for a further improvement of the transmission line performance. Alternatively, this kind of a succession of two or several via-holes may be replaced by an "extended" lead-through conductor, for example a metallized or metal-filled rectangular hole through the substrate having a corresponding or a different extension along the conductors.

Further preferred embodiments of the microwave circuit according to the invention are evident from the following claims.

Normally, microwave circuits of the kind in question are manufactured in a so-called encapsulated or sealed design, meaning a hermetical enclosure and electrical shielding of the circuit by means of a metal lid which is soldered onto the upperside of the substrate. For soldering of the lid the substrate is provided with a metal frame along its edge, said frame being connected to the underlying ground plane by via-holes. In order to obtain good and safe connection of the metal lid to the substrate it is necessary for said metal frame to have a width which is a number of times larger than the width of a microstrip conductor on the substrate. This means that the transmission line for external connection will cross said metal frame on the underside of the substrate. This crossing will give rise to parasitic capacitance deteriorating the performance of the circuit in the higher frequency range.

When said crossing is implemented according to prior art, for example according to said SE 9303142-5, a succession of practical reasons will decide the size of said parasitic capacitances and thereby the deterioration of the circuit performance at higher frequencies.

In a microwave circuit of the kind in question the connection pins of the circuit are generally provided by means of a so-called lead-frame, said frame adjoining the groundplane on the underside of the substrate. The metallization, that is the conductor crossing said metal frame and onto which a relevant connection pin is soldered, must have a width which is somewhat larger than the width of the connection pin in order to accept fitting tolerances and give room for the flow-out of solder and provide a satisfactory soldering quality.

Said metal lid is provided with a part, a so called lip, along its periphery, said part being soldered onto a metal frame on the upperside of the substrate. In order to provide a shielding action of said lid said frame is connected by via-holes to the ground plane on the underside, and said frame has a width which is somewhat larger than the lip of said lid in order to accept fitting tolerances and providing space for solder giving a satisfactory soldering quality. A wider lip on said lid gives improved possibilities of obtaining a tight soldering and thereby a hermetical enclosure. An increased width of the crossing conductor combined with an increased width of said metal frame in accordance with these practical needs will give rise to a substantially increased parallel capacitance to ground in said crossing and thereby a significant decrease of the higher useful freqeuncy limit of seal lead-throughs according to this prior art.

One further object of the invention is to provide a sealed microwave circuit having a seal lead-through not showing the mentioned disadvantages by making possible a controllable parallel capacitance at said crossing.

The object of invention is obtained by a sealed microwave circuit comprising a two-sided substrate having on its upperside the components of said microwave circuit and its underside being provided with a groundplane, the sealing being obtained by means of a tight and shielding lid being attached to a metal frame on the upperside of the substrate, said frame enclosing the circuit and being connected to the groundplane through via-holes, a seal lead-through connecting the microwave circuit to an external connection point on the underside of the substrate, wherein said seal lead-through comprises a first transmission line segment connected to one of said components on the upperside of the substrate, a symmetrical lead-through structure for transmitting microwaves through said substrate, and a second transmission line segment of microstrip design on the underside of the substrate for crossing said metal frame, said lead-through structure is provided by means opposite, equally sized, metallizationless areas and including in series the following
  a first coplanar waveguide segment connected to said first transmission line segment
  a lead-through conductor
  a second coplanar waveguide segment
  a width adaption segment of coplanar type for connection to the conductor of said microstrip line segment,
in which the respective conductors of said coplanar segments and said lead-through conductor are arranged within said metallizationless areas, and in which the center of said lead-through conductor is arranged symmetrically with respect to end portions of said coplanar waveguide segments, said end portions having a width which is adapted to said lead-through conductor, and the ground of said coplanar segments is provided by means of opposite metallization parts on the upperside and the underside, said metallization parts on the upperside being connected to said metal frame, forming the ground of said microstrip segment, the metallization parts on the underside being included in said ground plane.

Contradictory to prior art the seal lead-through of this design is composed of two steps, partly a lead-through structure without any discontinuities of the passage through the substrate, partly a microstrip line segment showing a small and well defined parallel capacitance for crossing said metal frame. In case said first transmission line segment is of a coplanar type, an end portion thereof is, so to say, included in the lead-through structure, while a further width adaption segment is introduced when making a connection to a microstrip line.

The actual microwave circuits are normally surface mounted onto an adjoining circuit board having a pattern of conductors interconnecting the microwave circuits and components thereof, this being illustrated in said U.S. Pat. No. 4,625,805. The conductors on this circuit board have a predetermined width, which is decided by the thickness of the circuit board, in order to provide a desirable conductor impedance value, that is normally 50 Ohm. In order to provide a good connection between the connection pins of the microwave circuit and the conductors on said circuit board an adapted width thereof is required. External connection of the microwave circuit according to this prior art requires that ground and conductor are available on the same side, that is a coplanar line, on the adjoining circuit board. This means a drawback which delimits the usefulness because external connection to a microstrip line is very often desirable. A further disadvantage is that the design offers small possibilities for obtaining the necessary adaption of the width of the connection pins without changing the impedance level and without discontinuities.

These drawbacks are eliminated according to one preferred embodiment of the sealed microwave circuit according to the invention, wherein said seal lead-through comprises a third transmission line segment of coplanar type between said second microstrip segment and said external connection point, said third coplanar segment being provided on the underside of a substrate part extending outside the sealing and having a metallizationless area on its upperside. This allows for a simplified adaption of the width of the coplanar waveguide conductor with maintained impedance value. This makes possible partly an adaption of the conductor width in order to obtain needed space for a good soldering of the connection pin onto the conductor, partly the selection of an adequate width of the connection pin in order to obtain a good connection to a corresponding conductor on an adjoining circuit board. The width adaptions which are necessary may be introduced on the substrate of the microwave circuit, simplifying thereby the mounting of the circuit on a circuit board and being an advantage in comparison with the prior art which is known from U.S. Pat. No. 4,626,805, in which an adaption of the width of the substrate connection pins may be carried out only outside the substrate itself because the connection is coplanar and in which the conductor of the adjoining circuit board is as well a coplanar type waveguide having the conductor as well as its ground placed on the upperside of the substrate.

When developing and implementing complex type microwave systems, advantages may be obtained if the system is built by modules, meaning that the system comprises several function modules, each implementing a defined microwave function. Then the design of the microwave system is simplified if each function module has a sealed microwave circuit design according to the invention which may be mounted directly onto an adjoining circuit board or a corresponding type of a carrier and in contact with conductors provided thereon. For this reason the invention is also concerned with a use of a function module design of a sealed microwave circuit according to the invention in a microwave circuit arrangement which is built by modules.

In order to further increase and facilitate the usefulness of a sealed microwave circuit according to the invention the same is preferably provided with a mounting flange or plate on the underside of the substrate and in contact with the ground plane. By means of this mounting flange the circuit may be easily attached to, preferably by means of screws, for example a heat sink on an underlying circuit board.

Further embodiments of a sealed microwave circuit according to the invention are evident from the following claims.

Generally, the invention is based on the understanding of the possibility in a microwave circuit built on a two-sided substrate of obtaining an improved microwave lead-through crossing the substrate without discontinuities, by a replacement of the via-hole which is normally used with a symmetrically designed lead-through structure comprising a first coplanar conductor on one side of the substrate, a lead-through conductor and a second coplanar conductor on the other side of the substrate, and the fact that this measure will eliminate the need of compensating impedance elements. Furthermore, it has been recognrized in such a microwave circuit that it is possible to obtain a seal lead-through for external connection of the microwave circuit having an improved impedance matching at different interfaces and an improved frequency performance, by an implementation of the seal lead-through in two steps, partly a first step including said symmetrical lead-through structure for crossing the substrate, partly a second step including a microstrip conductor having a well defined capacitance for crossing the metal frame which is comprised in the sealing. This may also be expressed in the way that the seal lead-through is sectioned into impedance matched transmission line segments and that coplanar segments are used for matching to viaholes thereof as well as external conductors in areas in which ground metallizations are available, may be formed and eliminated, respectively, without negative effects, and using microstrip segments in areas in which an opposite ground metallization necessarily must be crossed. From this follows that a general method for the provision of a seal lead-through having a good frequency performance is obtained by the invention.

BRIEF DESCRIPTION OF THE DRAWINGS

The invention will be more closely described in the following by embodiments and with reference to the drawings, in which.

On the drawings corresponding elements of the different figures have been provided with identical reference signs.

DETAILED DESCRIPTION OF THE INVENTION

Figure 1:
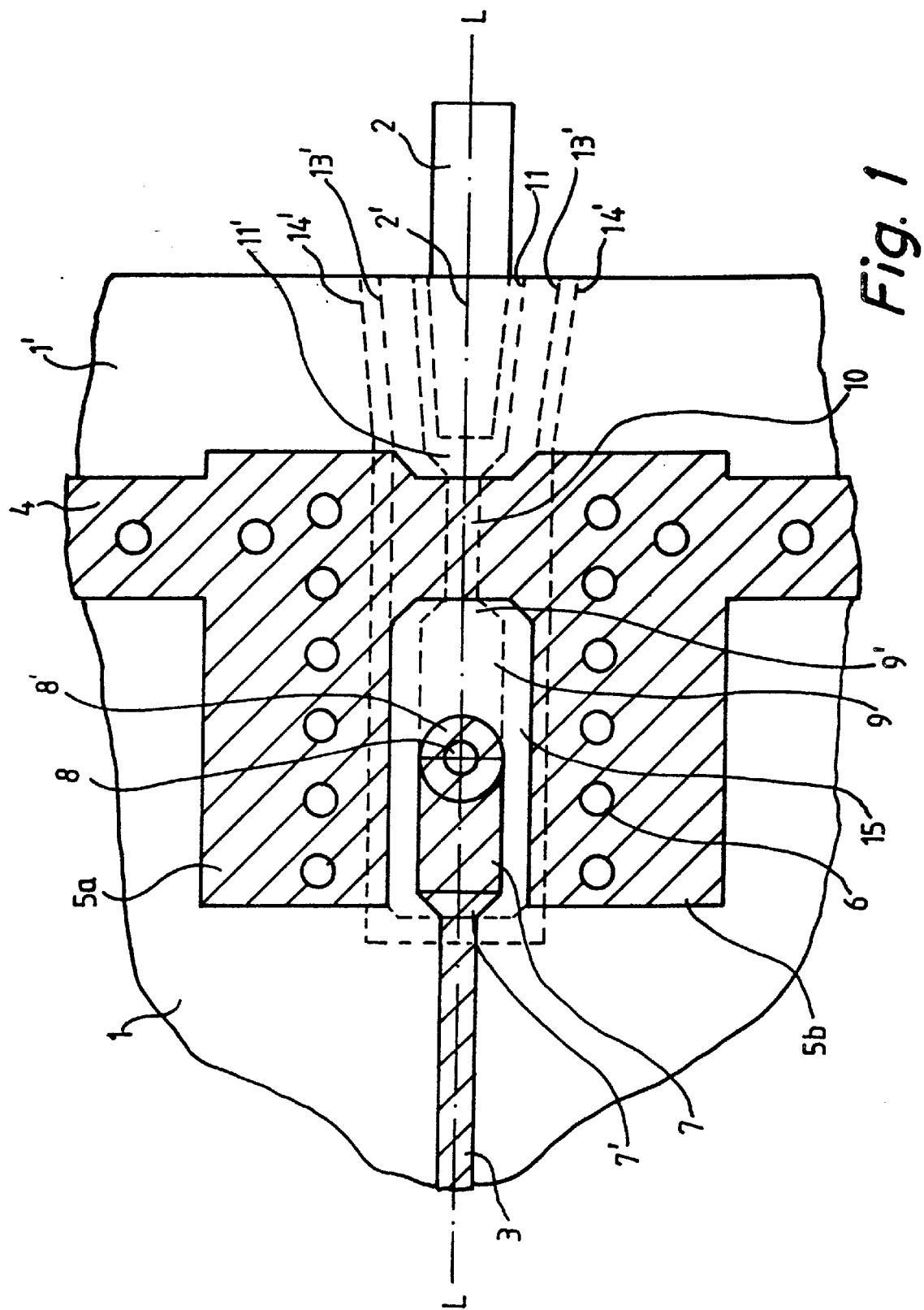
FIG. 1 discloses a part of a sealed microwave circuit according to the invention without the lid of the seal, illustrating the seal lead-through in a view from above.

FIG. 1 discloses a part of the portion of the sealed microwave circuit substrate 1 which includes the transmission line or seal lead-through for external connection of the microwave components and/or waveguide pattern of the circuit to an external connection point of the circuit. The sealing is obtained by means of a metal lid 12 (see FIG. 5) which is soldered to a metal frame 4, comprising a metallization layer on the upperside of the substrate. The substrate 1 comprises a part 1' extending outside the seal.

The microstrip line 3 forms a connection conductor to the microwave components of the circuit. The conductor 3 may also be a coplanar type of conductor. The microstrip line 3 is connected to the so called lead-through structure, comprising a first transmission line segment 7 of coplanar type, a metallized or metal filled hole 8 (via-hole) through the substrate 1, and on the underside of the substrate a second transmission line segment 9 of coplanar type. The seal lead-through comprises as well a third transmission line segment 10 of microstrip type, and a fourth transmission line segment 11 of coplanar type, onto which the connection pin 2 of the external connection point has been soldered. Said second, third and fourth segments are all situated on the underside of the substrate (FIG. 2) and has accordingly been indicated by dotted lines in FIG. 1.

Figure 2:
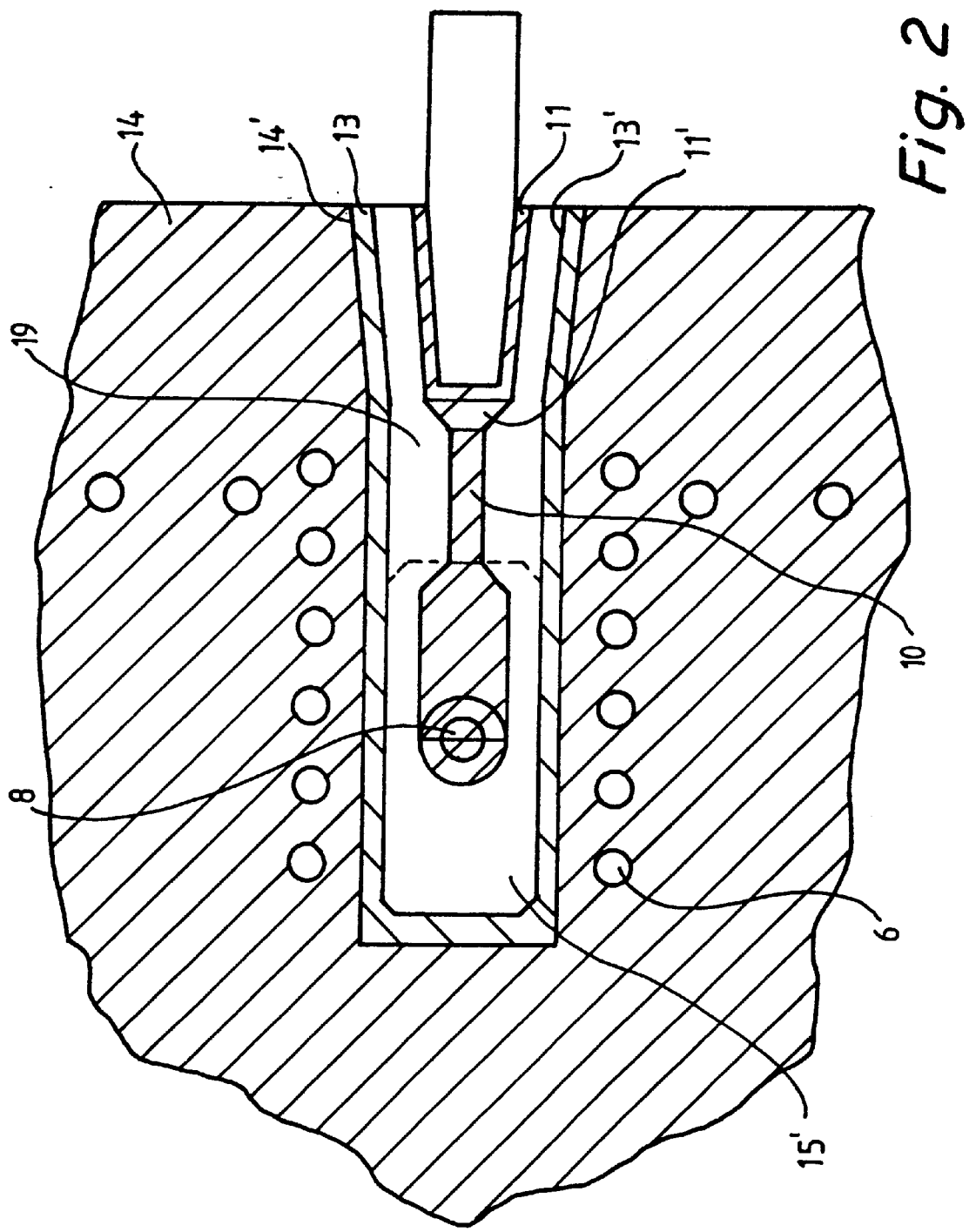
FIG. 2 discloses a partial view of FIG. 1 in a view from below.

The segment 7 is positioned in an interspace 15 between two parallel ground metallizations 5a, 5b, being connected to a ground plane 13 through rows of via-holes, said ground plane covering substantially the complete underside of the substrate (see FIG. 2). The ground metallizations 5a, 5b are also connected to the metal frame 4 and form a continuous metallization layer together with said frame as has been indicated by shadow lines. Said same metallization layer comprises the microstrip line 3, the coplanar conductor 7 and the interconnecting via-hole 8, having therefore corresponding shadow lines.

The coplanar segment 7 comprises a narrowing part 7' for adapting its width to the microstrip line 3. The conductor width of said segment has been adapted to a collar 8', normally circumventing a via-hole, in order to obviate impedance discontinuities at the interface between the conductor 7 and the via-hole metallization. In a corresponding manner the segment 9 has a narrowing part 9', and the coplanar segment 11 has a correspondingly narrowing part 11', for adapting the width thereof to the respective ends of the microstrip segment 10.

The connection pin 2 has a narrowing part 2' which is soldered onto the conductor of the coplanar segment 11, which has been indicated by a dotted line in FIG. 1. The width of the conductor 11 may easily be adapted to a desirable width of the connection pin 2.

FIG. 1 further discloses the dotted boundary line 13' of a groundplane-less area 19, (see also FIG. 2) on the underside of the substrate.

FIG. 2 discloses the underside of the substrate part 1 in FIG. 1, in which metallization areas positioned in the same plane have been indicated by corresponding shadow lines. The underside is covered by a metal layer 14 which is connected to the ground plane 13. The metal layer 14 is comprised in a so called lead-frame by means of which the connection pin 2 as well as remaining connection pins of the microwave circuit are provided.

The metal layer or lead-frame 14 has been eliminated within a surface area which is limited by the line 14'.

The ground plane 13 is forwardly extended under the lead-frame 14 and has the boundary line 13' towards the groundplane-less area 19. The area 19 includes an area part 15' of a size which corresponds to the interspace 15 (FIG. 1). Said coplanar line segment 9 is provided within said area part. The conductor of the segment 9 has a width which is identical to the width of the conductor of the segment 7 on the upperside of the substrate and is connected to the via-hole 8.

The line structure in FIG. 1 and 2 is symmetrically built, meaning that corresponding parts of the boundary lines of its metallizations and metallizationless areas are positioned at one and the same distance from the symmetry line L—L in FIG. 1. This ensures good microwave characteristics of the circuit. In an alternative design the structure may have a symmetrically bent shape or another shape deviating from the rectilinear shape disclosed on the drawing.

Figure 3:
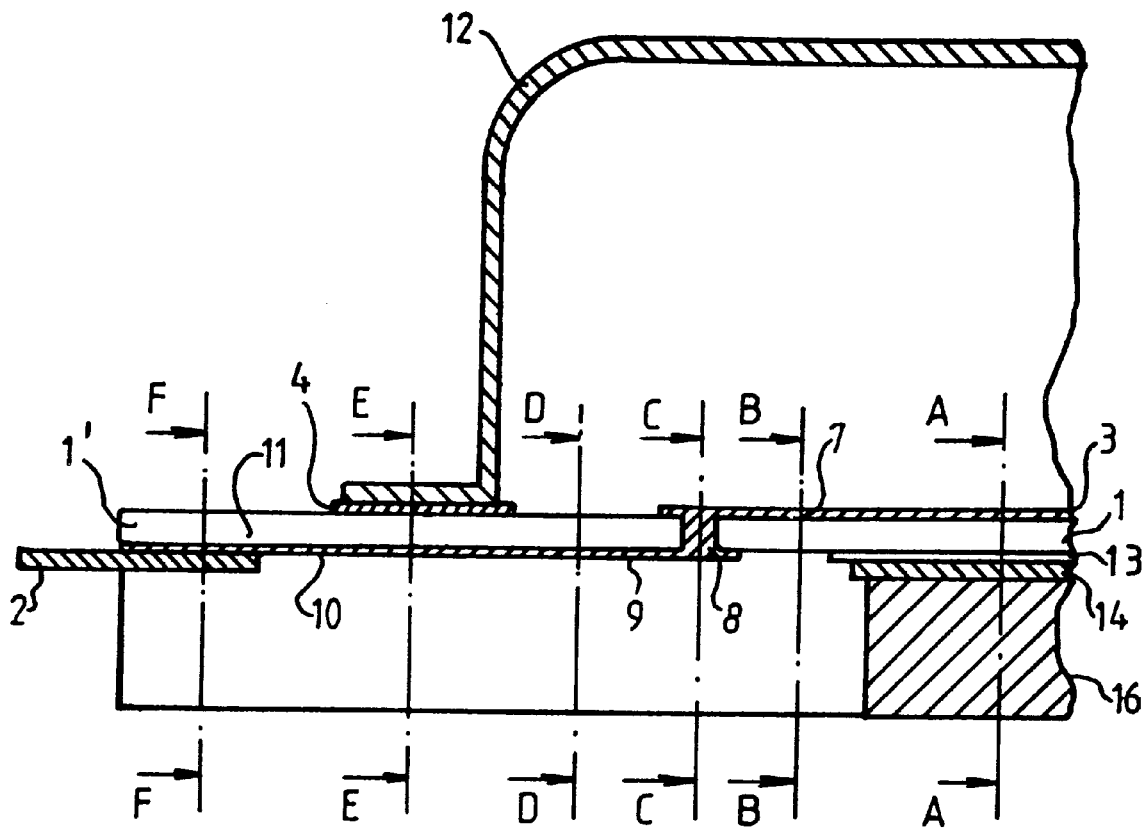
FIG. 3 discloses a section along the line L—L in FIG. 1, this view showing a supplementary lid and a mounting flange.

FIG. 3 discloses a section along the line L—L in FIG. 1, in which said microwave circuit has been provided with a supplementary lid 12 and a mounting flange or plate 16 adjoining the lead-frame 14. FIG. 3, as well as FIGS. 4a–4f, discloses the one and same main circuit structure as in FIGS. 1 and 2, yet said figures have been scaled differently.

The lid 12 (see also FIG. 5) is made from metal and has been soldered onto the circumventing metal frame 4. From FIG. 3 is clear that all of the metal frame 4, the line segment 7 and the microstrip line 3 are parts of one the same metallization layer, and furthermore that the upperside of the extending substrate part 1' is metallizationless. The ground plane 13 has been eliminated under the coplanar line segment 7, the ground thereof being formed by the metallization parts 5a, 5b in FIG. 1. Correspondingly, metallization is nonexistent above the coplanar line segment 9, the ground thereof being formed by adjoining parts of the ground plane 13 (see FIG. 2). It is furthermore disclosed by the figure that the connection pin 2 forms a part of the metal layer which is provided by the lead-frame 14.

Figure 4A:
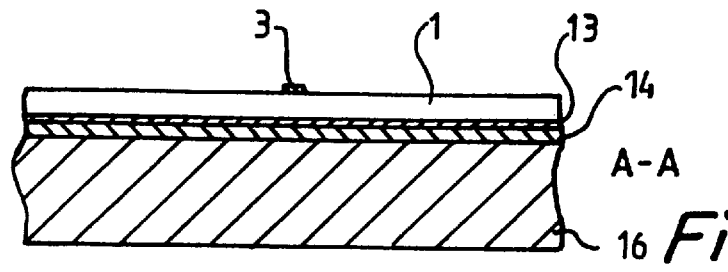
FIG. 4a–4f disclose sectional views along lines A—A to F—F in FIG. 3.

FIGS. 4a–f disclose section views along the lines A—A to F—F in FIG. 3. FIG. 4a shows at the top the conductor of the microstrip connection line 3, of which the ground is formed by the underlying ground plane 13.

Figure 4B:
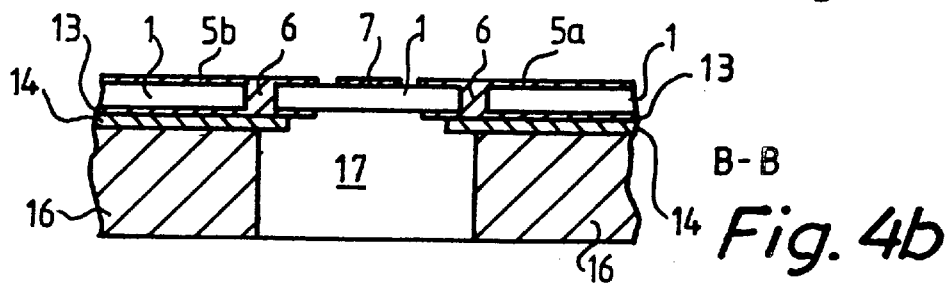

The section view in FIG. 4b illustrates the fact that the ground metallizations 5a, 5b have been connected to the underlying ground plane 13 through the via-holes 6. The figure furthermore illustrates that the ground plane 13 has been eliminated in order to form the metallizationless area 19, which is limited by the line 13', as well as the fact that a part of the lead-frame 14 has been eliminated in order to form the area which is limited by the line 14' (see FIG. 2). A recess 17 is disclosed on the mounting flange 16, said recess extending under the seal lead-through structure which has been described above, also being evident from FIG. 5.

Figure 4C:
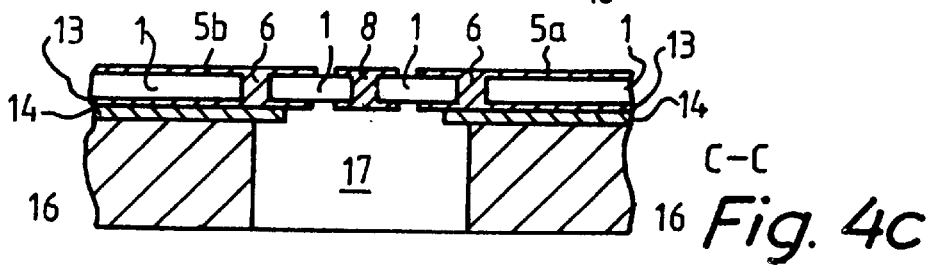

It is illustrated by FIG. 4c that the via-hole 8 interconnects the equal width coplanar conductors on the upperside and the underside.

Figure 4D:
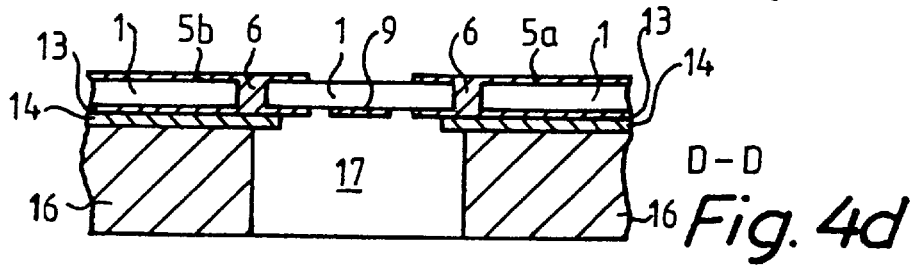

FIG. 4d illustrates the fact that the seal lead-through has transformed into the line segment 9 on the underside of the substrate.

Figure 4E:
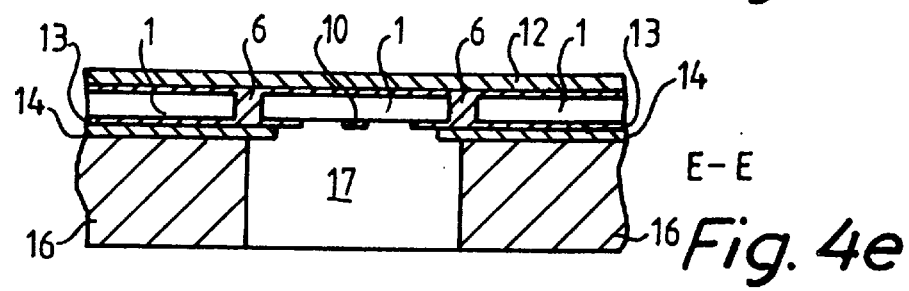

From FIG. 4e it is clear that said metal lid 12 is contacting the metal frame 4, being in turn connected to the underlying ground plane 13 through via-holes 6.

Figure 4F:
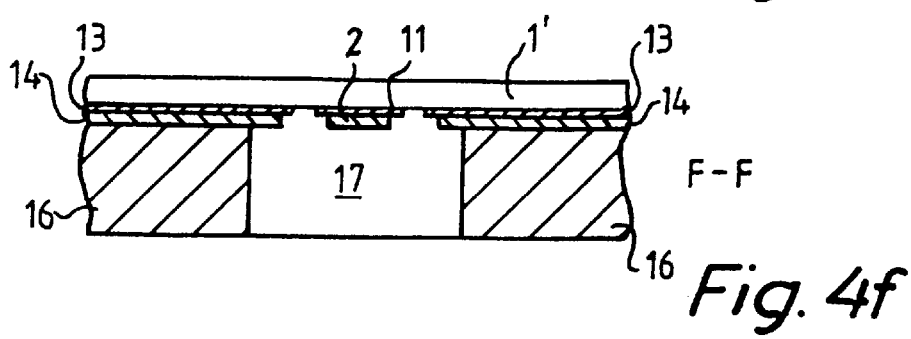

FIG. 4f discloses the fact that the extended substrate portion 1' is free from metallization on the upperside, and that the seal lead-through has transformed into a coplanar segment comprising the conductor 11, of which the width has been adapted for making possible a good solder joint between the connection pin 2 of the lead-frame 14 and the conductor 11.

Figure 5:
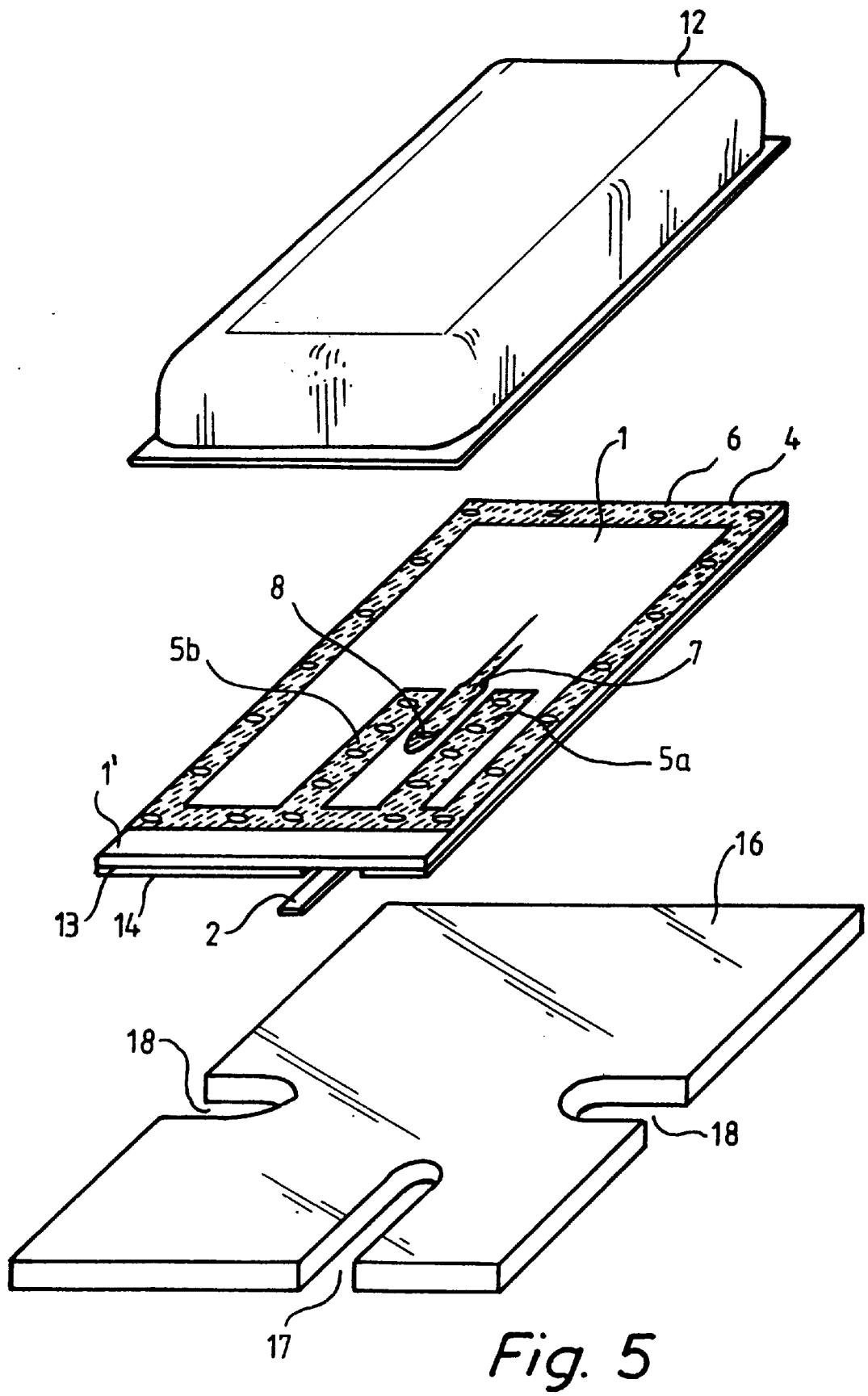
FIG. 5 discloses an exploded view of a sealed microwave circuit according to the invention including a lid and mounting flange thereof.

FIG. 5 discloses an exploded view of the microwave circuit according to the invention, comprising a metal lid 12 for hermetically enclosing and electrically shielding the microwave circuit, the microwave circuit itself being carried by the substrate 1 and the mounting flange or plate 16. The complete circuit substrate has been disclosed in the figure, on said substrate being illustrated only parts of relevance to the invention, that is the seal lead-through or transmission line for external connection of the microwave circuit.

The metal frame 4 circumvents the substrate 1, while leaving free the part 1' extending outside the lid 12. This figure illustrates the three metallization layers of the circuit, that is the metal frame 4, the groundplane 13, which has been illustrated by the border line between the substrate 1 and the underlying layer 14 and being connected to the metal frame 4 through the via-holes 6, and the lead-frame 14 which is connected to the ground plane. In turn, the lead-frame 14 is connected to the mounting flange 16 of metal. When the lid 12 is arranged against the metal frame the same is connected to ground through the via holes 6, the ground plane 13, the lead-frame 14 and the mounting flange 16.

The mounting flange is provided with a recess leaving a free space below the transmission line or seal lead-through structure which has been described above. The flange 16 is also provided with two screw recesses 18, for the microwave circuit to be screw-jointed to ground and to a heat sink on an adjoining circuit board.

The microwave circuit disclosed in FIGS. 1–5 has been provided with a connection pin 2. However, it is understood by the skilled man that the microwave circuit according to the invention may also be provided with a number of connection pins, for example, for current supply. The microwave circuit may comprise one or several seal lead-throughs of the kind which has been described for external connection of the circuit.

Figure 6A:
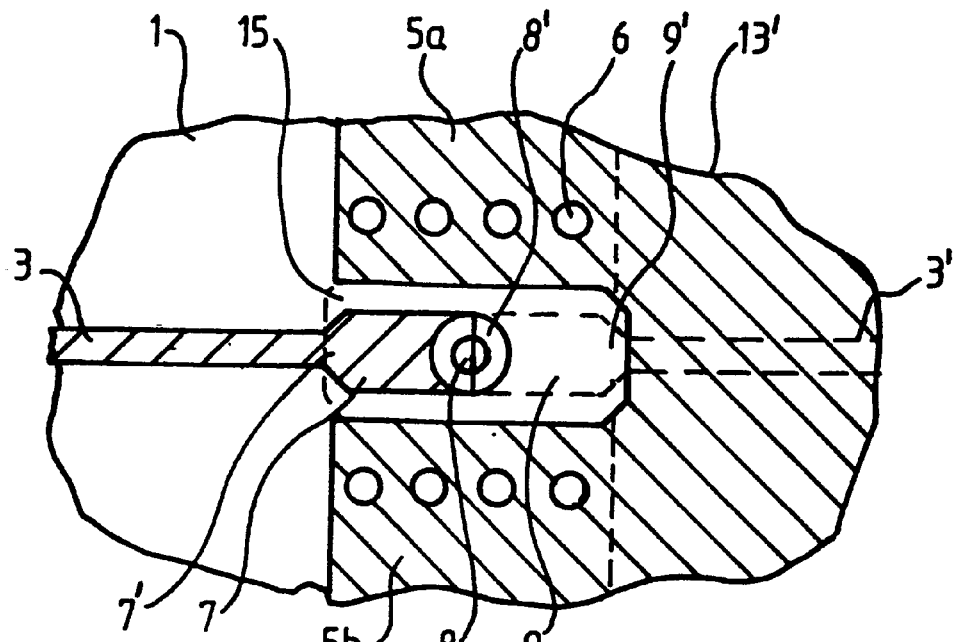
FIG. 6a–6b disclose in views from above respectively from below a part of a two-sided substrate comprising a lead-through structure according to the invention.
Figure 6B:
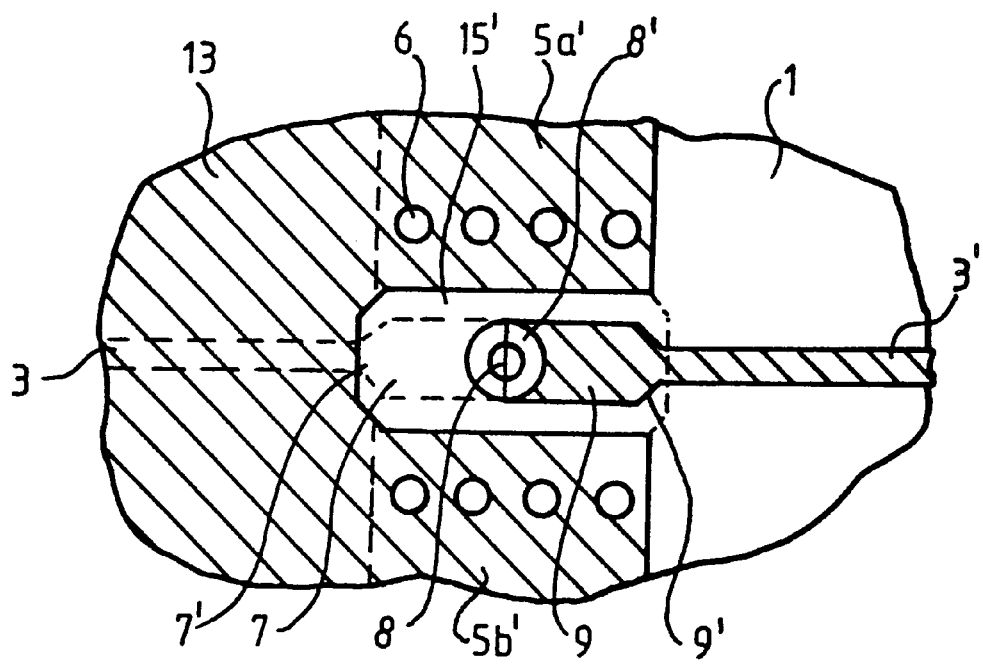

FIGS. 6a, 6b disclose a part of a two-sided substrate having a symmetrical lead-through structure of a microwave circuit according to the invention. The lead-through structure connects to microstrip line segments 3 and 3' on the upperside respectively underside of the substrate. Metallizations that may be seen have been marked by shadow lines, while underlying line structures and border lines have been indicated by dotted lines.

Referring to FIG. 6a the lead-through structure comprises metallization parts 5a, 5b forming a continuous metallization area together with the ground metallization 13', forming the ground of the microstrip segment 3'.

Correspondingly, the underside of the substrate in FIG. 6b discloses two opposite metallization parts 5a', 5b' being comprised in the lead-through structure and forming a continuous metallization area together with the ground metallization 13, forming the ground of the microstrip segment 3.

The opposite metallization parts 5a, 5a' respectively 5b, 5b' are interconnected in pairs by means of respective rows of symmetrically arranged via-holes 6 and are connected to the ground of the substrate as well.

FIG. 6a illustrates a metallizationless area 15, being provided between the metallization parts 5a, 5b, said area, according to FIG. 6b, corresponding with an opposite metallizationless area 15' provided on the underside of the substrate. Inside the area 15 a first coplanar line segment 7 of the lead-through structure has been provided between the microstrip line and a via-hole 8, being provided at the center of the areas 15, 15'. The underside of the substrate has a corresponding coplanar line segment 9 within the area 15', said segment interconnecting the via-hole 8 with the microstrip segment 3'. Identically shaped interface parts 7' respectively 9' have been provided for adapting the width of the respective coplanar segment conductors to the microstrip segments connected thereto.

The via-hole 8, which may be metallized or metal-filled, is surrounded by a metallization collar 8' on the upperside and the underside. The coplanar segment conductors 7 respectively 9 have a width corresponding to the diameter of said collar, thereby obviating line structure discontinuities.

It may be understood that said ground metallization 13' and the grounded metal frame 4 of the sealed microwave circuit that has been described above are corresponding elements, and that the microstrip segment 3' corresponds to the microstrip segment 10, while the metallization parts 5a', 5b' correspond to parts of the ground plane on the underside of the described circuit. Further, it may be understood that beyond the embodiments which have been disclosed numerous alternative embodiments may be conceived by the skilled man within the framework of the invention.

I claim:

1. A microwave circuit having a two-sided substrate comprising a lead-through structure for interconnecting a first microstrip line segment on the upperside of the substrate and a second microstrip line segment on the underside of the substrate, wherein said lead-through structure is symmetrically arranged by opposite, equally sized metallizationless areas on the upperside and the underside, said lead-through structure, within said metallizationless areas, comprises in series the conductor part of a first width adaption segment of coplanar type for connection to the conductor of said first microstrip segment the conductor of a first coplanar waveguide segment a lead-through conductor the conductor of a second coplanar waveguide segment the conductor part of a second width adaption segment of coplanar type for connection to the conductor of said second microstrip segment, the center of said lead-through conductor being arranged symmetrically in relation to end portions of said coplanar waveguide segments, and the respective conductors of said first and second waveguide segments having a width which has been adapted to said lead-through conductor, and the ground of said coplanar segments being provided by means of opposite metallization parts on the upperside and the underside, said parts being interconnected by equidistantly arranged lead-throughs along and transverse to the structure, said parts, together with the respective ground metallizations of said microstrip segments being included in respective continuous ground metallization areas on the underside and upperside, thereby providing a continuous lead-through structure having along the structure a substantially uniform impedance level which may be adapted to the environment.

2. A microwave circuit as claimed in claim 1, wherein said opposite metallizationless areas are substantially rectangular, said opposite metallization parts, forming the ground planes of said coplanar segments, are interconnected by means of parallel lead-through rows along edge areas adjoining the longsides of said rectangular areas, and said lead-through conductor is arranged to cross said substrate at the center of said metallizationless areas and comprises a metallized or metal-filled via-hole having on the upperside and the underside adjoining, substantially circular metallizations of a diameter substantially corresponding to the width of said coplanar line segment conductors.

3. A microwave circuit as claimed in claim 1 or 2, wherein said first and second microstrip line segment have the one and same conductor width, and said coplanar width adaption segments are identically shaped.

4. A sealed microwave circuit comprising a two-sided substrate carrying on its upperside the microwave circuit components and on its underside being provided with a groundplane, the sealing being obtained by means of a tight and shielding lid, being fixed to a metal frame on the upperside of the substrate, said frame circumventing the circuit and being connected to said ground plane through via-holes, a seal lead-through interconnecting the microwave circuit with an external connection point on the underside of the substrate, wherein said seal lead-through comprises a first transmission line segment which is connected to one of said components on the upperside of the substrate, a symmetrical lead-through structure for transmitting microwaves through said substrate, and a second transmission line segment of microstrip design on the underside of the substrate for crossing said metal frame, said lead-through structure is provided by opposite, equally sized, metallizationless areas and comprises in series a first coplanar waveguide segment connected to said first transmission line segment a lead-through conductor a second coplanar waveguide segment a width-adaption segment of coplanar type for connection to the conductor of said microstrip line segment, in which the respective conductors of said coplanar segments and said lead-through conductor have been arranged within said metallizationless areas, and in which the center of said lead-through conductor has been arranged symmetrically in relation to end-portions of said coplanar waveguide segments, said portions having a width which has been adapted to said lead-through conductor, and wherein the ground of said coplanar segments is provided by means of opposite metallization parts on the upperside and the underside, the metallization parts on the upperside being connected to said metal frame, forming the ground of said microstrip segment, the metallization parts on the underside being included in said ground plane.

5. A microwave circuit as claimed in claim 4, in which said first transmission line segment has a microstrip design, wherein said lead-through structure comprises a further width adaption segment of coplanar type for connecting the conductor of said first microstrip line segment to the conductor of said first coplanar wave-guide segment, the conductor part of said further coplanar width-adaption segment being positioned within said metallizationless areas.

6. A microwave circuit as claimed in claim 4 or 5, wherein said seal lead-through comprises a third transmission line segment of coplanar design between said second microstrip segment and said external connection point, and said third coplanar segment is arranged on the underside of a substrate part extending outside the sealing, said part having a metallizationless area on its upperside.

7. A microwave circuit as claimed in claim 6, said external connection point comprising a connection pin 25 being connected to said third coplanar segment, wherein the width of said connection pin is adapted for connection to an external waveguide, and the conductor of said third coplanar segment is adapted for the joint thereof to said connection pin.

8. A microwave circuit as claimed in claim 7, comprising several external connection points having respective connection pins, said pins being arranged by means of a lead-frame resting against said ground plane, wherein said circuit is provided with a metal mounting flange or plate, resting against said lead-frame and being connected to said ground plane, for mounting of the circuit onto an adjoining circuit board with a connection to ground and a thermal connection to a heat sink, said flange or plate having a recess within an area corresponding to the surface which is occupied by said seal lead-through.

9. A microwave circuit as claimed in claims 4 or 5, said lead-through conductor comprising a metallized via-hole having a circumventing collar on both sides of the substrate, wherein said metallization parts form two extended parts adjoining said metal frame, the parallel edges of said parts defining said metallizationless area on the upperside of the substrate and having an opposite equally sized metallizationless area on the underside of the substrate, in which said metallized via-hole is arranged at the center of said areas, and in which the conductors of said coplanar line segments have a width which is the same as the width of the respective collars connected thereto.

* * * * *